United States Patent
Kim et al.

(10) Patent No.: US 7,394,303 B2
(45) Date of Patent: Jul. 1, 2008

(54) PULSE GENERATOR USING LATCH AND CONTROL SIGNAL GENERATOR HAVING THE SAME

(75) Inventors: Do-Kyung Kim, Yongin-si (KR);
Jung-Bong Lee, Suwon-si (KR);
Hyun-Young Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 60 days.

(21) Appl. No.: 11/553,723

(22) Filed: Oct. 27, 2006

(65) Prior Publication Data

US 2007/0096791 A1    May 3, 2007

(30) Foreign Application Priority Data

Oct. 28, 2005 (KR) .................. 10-2005-0102500

(51) Int. Cl.
*G06F 1/04* (2006.01)
(52) U.S. Cl. ........................... 327/291; 327/295
(58) Field of Classification Search ............... None
See application file for complete search history.

(56) References Cited

U.S. PATENT DOCUMENTS

| | | | | |
|---|---|---|---|---|
| 5,079,440 A | * | 1/1992 | Roberts et al. ............. | 327/155 |
| 6,198,327 B1 | * | 3/2001 | Takahashi .................. | 327/291 |
| 6,369,627 B1 | * | 4/2002 | Tomita ....................... | 327/158 |
| 7,075,352 B2 | * | 7/2006 | Kim et al. .................. | 327/291 |
| 7,202,724 B2 | * | 4/2007 | Kim ........................... | 327/218 |

FOREIGN PATENT DOCUMENTS

| | | |
|---|---|---|
| JP | 09-284101 | 10/1997 |
| JP | 10-224208 | 8/1998 |
| KR | 1020040074679 A | 8/2004 |

* cited by examiner

*Primary Examiner*—Cassandra Cox
(74) *Attorney, Agent, or Firm*—F. Chau & Associates, LLC

(57) ABSTRACT

An exemplary embodiment of the present invention provides a pulse generator generating a control signal to control a latch unit included in a source driver for sequentially latching input data applied to a source data line of a display device, wherein the pulse generator includes a latch circuit latching an input signal in response to an N-divided clock signal and applying the latched input signal as an output signal, and a logic unit generating a pulse signal by logically multiplying the input signal by the N-divided clock signal, wherein the output signal is provided as an input signal to the latch circuit of another pulse generator, and the pulse signal is provided to the latch unit as the control signal.

13 Claims, 6 Drawing Sheets

PULSE GENERATOR USING LATCH AND CONTROL SIGNAL GENERATOR HAVING THE SAME

CROSS-REFERENCE TO RELATED PATENT APPLICATION

This application claims priority to Korean Patent Application No. 10-2005-0102500, filed on Oct. 28, 2005, the contents of which are incorporated herein by reference in their entirety.

BACKGROUND OF THE INVENTION

1. Technical Field

The present invention relates to a pulse generator and, more particularly, to a pulse generator using a latch for generating a pulse to sequentially latch input data applied to a source data line of a liquid crystal display device.

2. Discussion of Related Art

Liquid crystal display (LCD) devices are used widely in, for example, notebook computers and monitors. In an LCD device a controlled electric field is applied to a liquid crystal (LC) material having an anisotropic dielectric constant, disposed between two panels to control light transmission for displaying an image.

Conventional LCD devices include two panels for implementing an image and have a plurality of pixels. The plurality of pixels is disposed in an area in which a plurality of scan lines applying gate selection signals intersect a plurality of source data lines applying color data, e.g., grayscale data.

To latch the color data for the individual source data lines of the LCD device with a conventional latching circuit, a series of latch signal pulses is generated and applied in sequence. A plurality of pulse generators is connected in series, with each pulse generator producing a latch signal pulse for latching color data and a next data signal pulse for operating the next pulse generator in the series. The pulse generators are triggered by the same, substantially square wave, system clock so the intervals and durations of the pulses are uniform. A start pulse is generated based on the clock and is, for example, a high logic level pulse with a duration of about one cycle of the clock. The start pulse can begin and end on subsequent edges of the clock, such as rising edges.

In a first pulse generator of the series of pulse generators, the start pulse is input as a data signal to a first latching device, such as a flip-flop, and is latched into the first latching device on an opposite edge of the clock from the start pulse, such as a falling edge, so the logic level of the start pulse that began on a rising edge of the clock is stable by the time the falling edge of the clock occurs. The start pulse is at a low logic level by the time the next falling edge of the clock latches the first latching device. The two latching operations causes a high logic level first pulse that is one clock cycle in duration and one half clock cycle delayed from the start pulse. The resulting first pulse is used as a first one of the series of latch signals and is also used with a second latching device to produce a next data signal in a similar manner. The first pulse is input as a data signal to the second latching device and is latched into the second latching device on the same rising edge of the clock that ended the start pulse. The first pulse is at a low logic level by the time the next rising edge of the clock latches the second latching device. The two latching operations of the second latching device causes a high logic level second pulse that is one clock cycle in duration, one half clock cycle delayed from the first pulse, and one clock cycle delayed from the start pulse. The resulting second pulse is used as the data signal to the first latching device of the next pulse generator in the series of pulse generators.

In the series of pulse generators, each pulse generator produces a latch signal pulse that is one clock cycle in duration and one clock cycle delayed from the latch signal pulse of the previous pulse generator, and a next data signal pulse that is one clock cycle in duration and one clock cycle delayed from the next data pulse of the previous pulse generator. If a start pulse has a multiple clock cycle duration, then the resulting latch pulses may also have a multiple clock cycle duration. There may be as many pulse generators in the series as there are source data lines in a section of or in the entire LCD device.

FIG. 1 is a circuit diagram of a conventional pulse generator using flip-flops. As illustrated in FIG. 1, each pulse generator 10 includes a first flip-flop 11 and a second flip-flop 12 for latching a data signal A and for generating a latch pulse CLK and a next data signal NEXT_DIN in response to a predetermined clock signal SH_CLK. The first flip-flop 11 has a data input D, an inverted clock input CKB, a reset input RN, and a latched output Q. The second flip-flop 12 has a data input D, a clock input CK, a reset input RN, and a latched output Q. Each flip-flop 11 and 12 is reset by a low logic level of a predetermined reset signal RSTB applied to the reset inputs RN. The first flip-flop 11 receives a start signal SR_START at the data input D and latches a logic level of the start signal SH_START, such as a high logic level, through the latched output Q as latch signal CLK in response to a falling edge of a predetermined clock signal SH_CLK at the inverted clock input CKB of the first flip-flop 11. The latched output Q of the first flip-flop 11 is reset in response to a next falling edge of the predetermined clock signal SH_CLK when the start signal SH_START changes logic levels, such as to a low logic level.

The latch signal CLK from the latched output Q of the first flip-flop 11 is in the form of a pulse and is used to latch the color data applied to one of the source data lines of the LCD device.

The latch signal CLK is also applied to the data input D of the second flip-flop 12, and latches a logic level of the latch signal CLK, such as a high logic level, through the latched output Q of the second flip-flop 12 as a next data signal NEXT_DIN in response to a rising edge of the predetermined clock signal SH_CLK at the clock input CK of the second flip-flop 12. The latched output Q of the second flip-flop 12 is reset in response to a next rising edge of the predetermined clock signal SH_CLK when the latch signal CLK changes logic levels, such as to a low logic level.

The next data signal NEXT_DIN from the latched output Q of the second flip-flop 12 is applied as the data signal A to a next pulse generator (not shown) connected in series with the pulse generator 10.

FIG. 2 is a block diagram of a series of the conventional pulse generators of FIG. 1. As illustrated in FIG. 2, each pulse generator 10-1 to 10-n has a start signal input A, which is the data input D of the first flip-flop 11, a latch signal output CLK, which is the latched output Q of the first flip-flop 11, and a next start signal output NEXT_DIN, which is the latched output Q of the second flip-flop 12. Second through last pulse generators 10-2 to 10-n have next start signals NEXT_DIN from the previous pulse generators 10-1 to 10-n-1 applied to their start signal inputs A, respectively. The first pulse generator 10-1 in the series has the start signal SH_START applied to its start signal input A. The next start signal output NEXT_DIN of the last pulse generator 10-n is unused.

The first through last latch signal outputs CLK of the first through last pulse generators 10-1 to 10-n are applied to the LCD device as latch enable signals CLK1 to CLKn to latch the color data applied to the plurality of source data lines.

FIG. 3 is a timing diagram illustrating operations of the pulse generators of FIGS. 1 and 2. The timing chart illustrated in FIG. 3 relates to a case in which a color data signal is input to 240 data lines crossing a row in an LCD device. When a synchronization signal HSYNC indicating an input cycle for a row of color data signals is enabled, the first and second flip-flops 11 and 12 are reset, and the start signal SH_START is sent to the data input D of the first flip-flop 11 of the first pulse generator 10-1.

The logic level of the start signal SH_START is latched at the latched output Q of the first flip-flop 11 of the first pulse generator 10-1 in response to a failing edge of the predetermined clock signal SH_CLK, and a latched output CLK from the output terminal Q of the first flip-flop 11 is output as first latch signal CLK1 from the first pulse generator 10-1 in the form of a pulse and is used for latching color data sent to the first source data line. The latched output Q CLK of the first flip-flop 11 is applied to the second flip-flop 12 and is output from the latched output Q of the second flip-flop 12 in response to a rising edge of the predetermined clock signal SH_CLK.

A latched output signal NEXT_DIN of the second flip-flop 12 is applied as an input to the next pulse generator connected in series to the pulse generator 10. A flip-flop included in the next pulse generator receives the output signal NEXT_DIN and applies an output signal CLK2 in response to a falling edge of the clock signal SH_CLK. Accordingly, the output signals CLK1 and CLK2 generated by the adjacently connected pulse generators have a phase difference of one cycle of the clock signal SH_CLK between each other. Accordingly, data SH_DATA:[17:0] for a pixel is transmitted to the source data line during a cycle of the clock signal SH_CLK.

An enable signal ENABLE illustrated in FIG. 2 is a control signal controlling the transmission of data signals to a pixel implementing an image. The timing chart of the enable signal ENABLE shows an operation of transmitting grayscale data PD[17:0] to the pixel in response to a predetermined clock signal DOTCLK during an active period of the enable signal ENABLE.

However, in a conventional pulse generator using flip-flops as described above, since there is energy consumption in gates to which a clock signal is applied whenever the clock signal toggles, as the number of pulse generators increases, the number of gates accordingly increases. Thus, more space is occupied and unnecessary electric power is consumed.

SUMMARY OF THE INVENTION

The present invention provides a pulse generator to minimize space occupation and to reduce unnecessary consumption of electric power.

An exemplary embodiment of the present invention provides a pulse generator generating a control signal to control a latch unit included in a source driver for sequentially latching input data applied to a source data line of a display device, wherein the pulse generator includes a latch circuit latching an input signal in response to an N-divided clock signal and applying the latched input signal as an output signal, and a logic unit generating a pulse signal by logically multiplying the input signal by the N-divided clock signal, wherein the output signal is provided as an input signal to the latch circuit of another pulse generator, and the pulse signal is provided to the latch unit as the control signal.

The logic unit may comprise a NAND gate receiving the input signal and the N-divided clock signal, and performing a NAND operation on the received signals, and an inverter inverting an output of the NAND gate and outputting the inverted output signal of the NAND gate as the pulse signal.

The N-divided clock signal may be a 2-divided clock signal.

The N-divided clock signal may have a duration of twice a sequential data latching cycle and may have a pulse width of half of the sequential data latching cycle.

The output signal may have a pulse width of one cycle of the N-divided clock signal, and the pulse signal may have the same pulse width as that of the N-divided clock signal.

An exemplary embodiment of the present invention provides a control signal generation circuit controlling a latch unit included in a source driver for sequentially latching input data applied to a source data line of a display device, the control signal generation circuit including a plurality of pulse generators, wherein the pulse generator comprises a latch circuit latching an input signal in response to an N-divided clock signal and applying the latched input signal as an output signal, and a logic unit generating a pulse signal by logically multiplying the input data by the N-divided clock signal, wherein an output signal generated by an n-th (n is a natural number) pulse generator is applied to an input of an (n+1)-th pulse generator, and a pulse signal generated by the n-th pulse generator is applied as a control signal to the latch unit for latching an n-th input data.

BRIEF DESCRIPTION OF THE DRAWINGS

Exemplary embodiments of the present invention can be understood in more detail from the following descriptions taken in conjunction with the attached drawings in which.

DETAILED DESCRIPTION OF THE INVENTION

Figure 1:
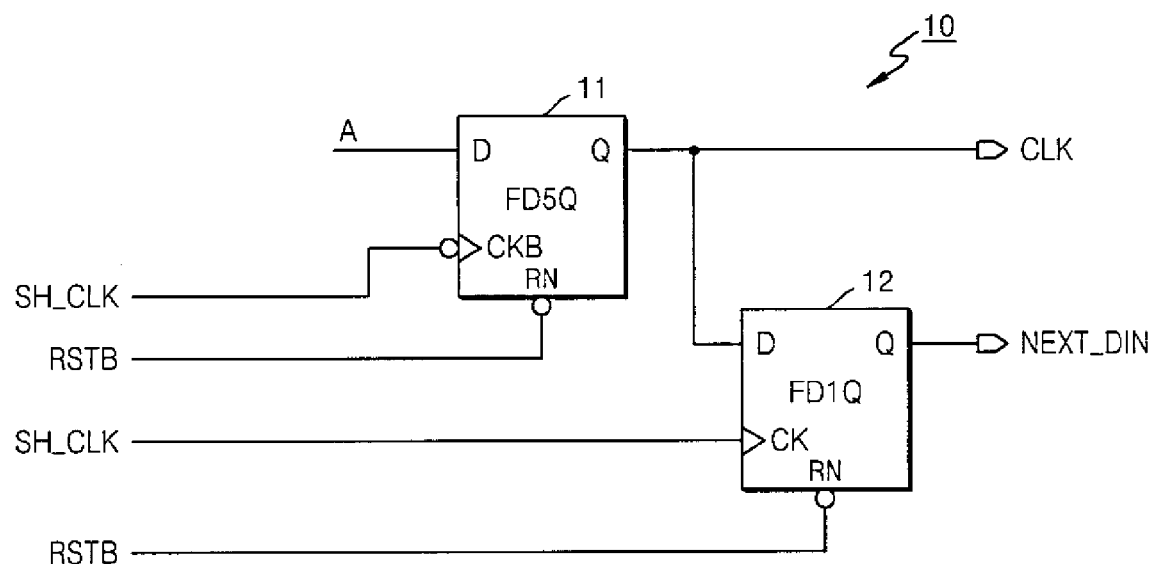
FIG. 1 is a circuit diagram of a conventional pulse generator using flip-flops.
Figure 2:
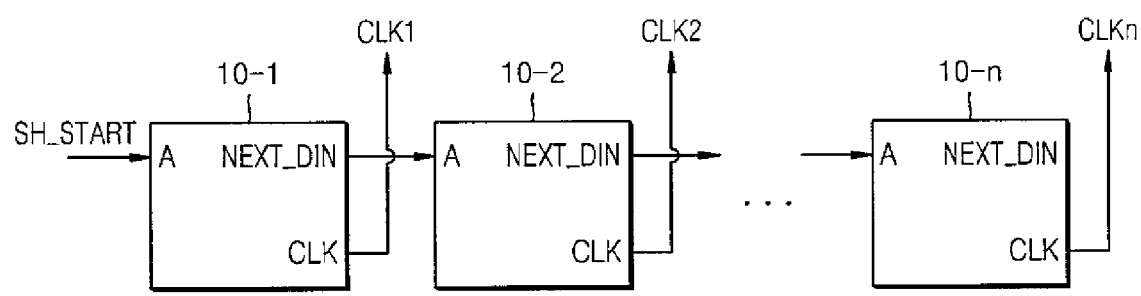
FIG. 2 is a block diagram of a series of the conventional pulse generators of FIG. 1.
Figure 3:
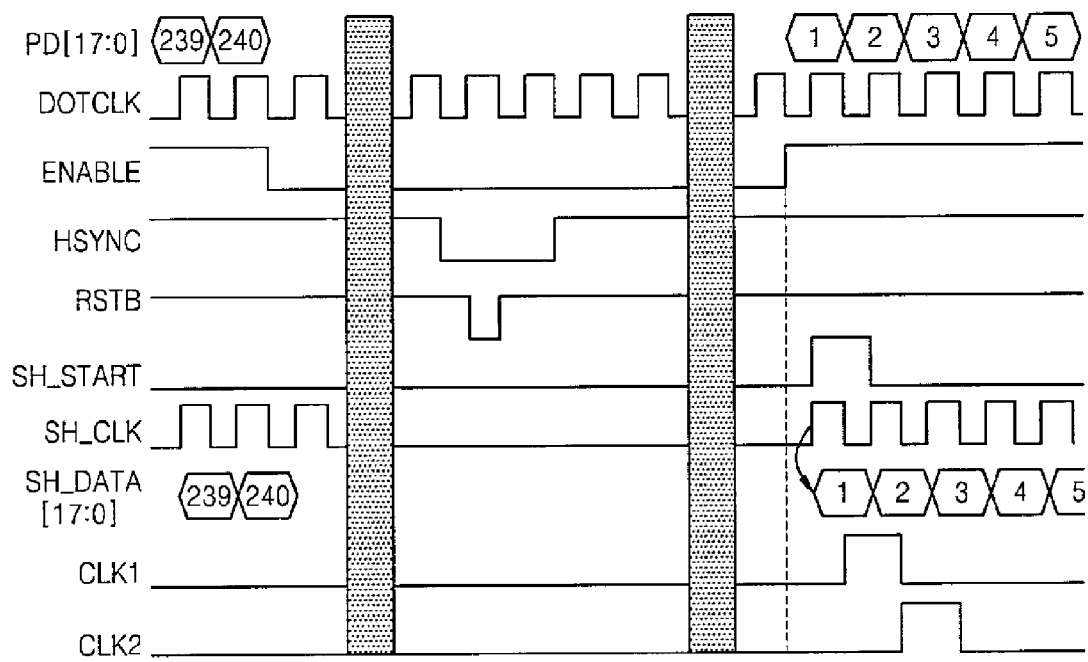
FIG. 3 is a timing diagram illustrating operations of the conventional pulse generators of FIGS. 1 and 2.

The present invention will now be described more fully with reference to the accompanying drawings, in which exemplary embodiments of the invention are shown. Like reference numerals denote like elements in the drawings.

To latch the color data for the individual source data lines of the LCD device with a latching circuit according to an embodiment of the present invention, a series of latch signal pulses is generated and applied in sequence. A plurality of pulse generators is connected in series, with each pulse generator producing a latch signal pulse for latching color data and a next data signal pulse for operating the next pulse generator in the series. The pulse generators are triggered by one of a plurality of generated clock signals with, for example, logic high pulses. In a case where there are two generated clock signals, one generated clock signal is an odd clock signal and the other generated clock signal is an even clock signal. A first, third, fifth, and so on pulse generator may be triggered by the odd clock signal and a second, fourth, sixth, and so on pulse generator may be triggered by the even clock signal. The odd and even clock signals are derived from a substantially square wave, system clock so the intervals and durations of the pulses are uniform. A first, third, fifth, and so on pulse of the system clock is used for the odd clock signal and a second, fourth, sixth, and so on pulse of the system clock is used for the even clock signal. The resulting odd and even clock signals have periods that are about twice that of the system clock, with pulse durations that are about half the period of the system clock.

A start pulse is generated based on the system clock and is, for example, a high logic level pulse with a duration of about two cycles of the system clock. The start pulse can begin and end on edges of the system clock, such as rising edges.

In a first pulse generator of the series of pulse generators, the start pulse is input as a data signal along with the odd clock signal. In a logic unit, the data signal is logically multiplied by the odd clock signal, resulting in a logic high multiplied pulse that has a duration of about one half the system clock cycle and is delayed one system clock cycle from the data signal. The resulting multiplied pulse is output to be used as a first one of the series of latch signal pulses. The data signal is also latched into a latching circuit on, for example, a first rising edge of the odd clock signal, so the logic level of the data signal, which comes from the start pulse that began about on a first rising edge of the system clock, is stable by the first rising edge of the odd clock signal, which is about when the second rising edge of the system clock occurs. The data signal becomes a low logic level about when a third rising edge of the system clock occurs and remains at the low logic level when a next rising edge of the odd clock signal, which is about when a fourth rising edge of the system clock occurs, latches the latching circuit having an output of a logic low level. The two latching operations causes a high logic level latched pulse that has a duration of about one odd clock signal cycle, or about two system clock cycles, and is about one system clock cycle delayed from the data signal. The resulting latched pulse is output as a next data signal to a second pulse generator in the series of pulse generators.

In the second pulse generator of the series of pulse generators, the next data signal from the first pulse generator is input as a data signal along with the even clock signal. In the logic unit of the second pulse generator, the data signal is logically multiplied by the even clock signal, resulting in a logic high multiplied pulse, similar to that of the first pulse generator, that has a duration of about one half the system clock cycle and is delayed one system clock cycle from the data signal. The resulting multiplied pulse is output to be used as a second one of the series of latch signal pulses. The data signal is also latched into a latching circuit of the second pulse generator on a first rising edge of the even clock signal, so the logic level of the data signal, which comes from the next data signal from the first pulse generator that began about on the second rising edge of the system clock, is stable by the first rising edge of the even clock signal. The data signal becomes a low logic level about when the third rising edge of the system clock occurs and remains at the low logic level when a next rising edge of the even clock signal latches the latching circuit having an output of a logic low level. The two latching operations causes a high logic level latched pulse that has a duration of about one even clock signal cycle, or about two system clock cycles, and is about one system clock cycle delayed from the data signal. The resulting latched pulse is output as a next data signal to a third pulse generator in the series of pulse generators.

In the series of pulse generators, each pulse generator produces a latch signal pulse that is one half system clock cycle in duration and one system clock cycle delayed from the latch signal pulse of the previous pulse generator, and a next data signal pulse that is two system clock cycles in duration and one system clock cycle delayed from the next data signal pulse of the previous pulse generator. If a start pulse has a longer duration, then the resulting latch pulses may also have a longer duration. There may be as many pulse generators in the series as there are source data lines in a section of or in all of the LCD device.

Figure 4:
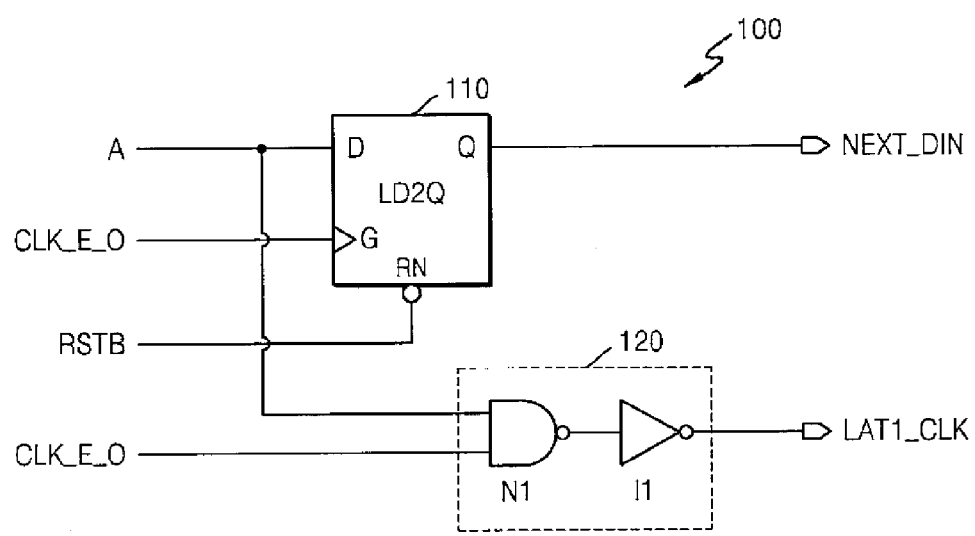
FIG. 4 is a circuit diagram of a pulse generator according to an embodiment of the present invention.

FIG. 4 is a circuit diagram of a pulse generator according to an embodiment of the present invention. As illustrated in FIG. 4, each pulse generator 100 includes a latch circuit 110 and a logic unit 120. The latch circuit 110 latches a data signal A input to a data input D of the latch circuit 110 in response to an N-divided clock signal CLK_E_O which is applied to a clock input G of the latch circuit 110 and outputs a next data signal NEXT_DIN. The logic unit 120 outputs the latch signal LAT1_CLK in the form of a pulse generated by logically multiplying the data signal A by the N-divided clock signal CLK_E_O.

For latching a plurality of data signals applied from a source data line of the display device, a plurality of pulse generators 100 are connected in series and respectively apply control signals to latch the plurality of data signals.

The latch circuit 110 of the first pulse generator latches a start signal START_L/R as the data signal A in response to the N-divided clock signal CLK_E_O. The N-divided clock signal CLK_E_O may be a 2-divided clock signal. In this case, either an odd clock signal CLK_O or an even clock signal CLK_E may be input to the latch circuit 110 and the logic unit 120.

The start signal START_L/R and the N-divided clock signal CLK_E_O are respectively applied to a first and second input terminal of a NAND gate N1 and are subjected to a logical NAND operation before being applied to an input of an inverter I1. The inverter I1 inverts the output of the NAND gate N1 and outputs the inverted signal as the pulse signal LAT1_CLK. The pulse signal LAT1_CLK is input to a latch unit (not shown) as a control signal for sequentially latching the source data in the LCD device.

The output signal NEXT_DIN output from the latch circuit 110 is applied to the data input D of the latch circuit 110 and the logic unit 120 of a second pulse generator (not shown).

Referring to FIG. 4, a local reset signal RSTB is applied to a reset input RN of the latch circuit 110, and the latch circuit 110 is reset in response to a low logic level of the local reset signal RSTB.

Figure 5:
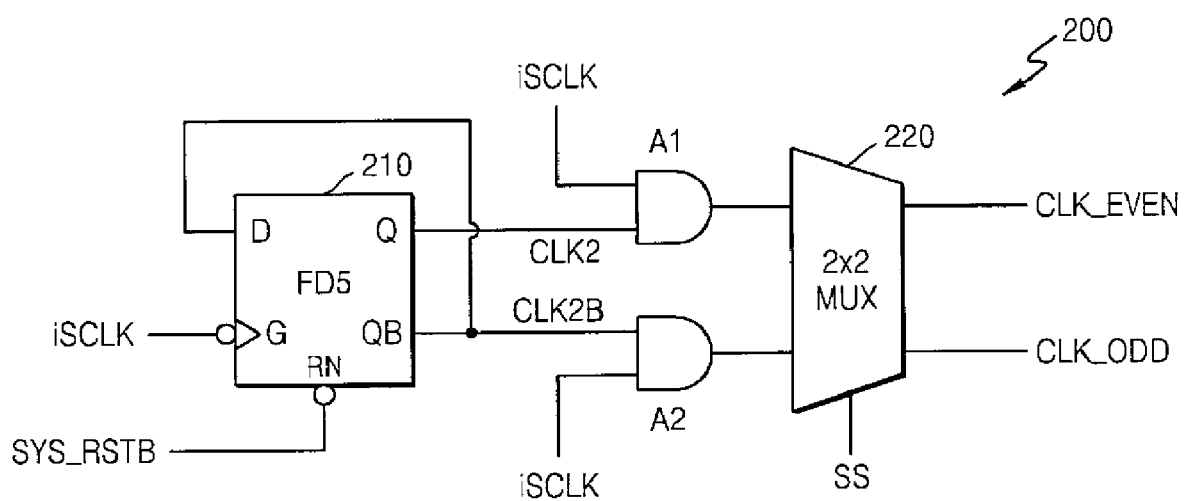
FIG. 5 is a circuit diagram of a clock signal generation unit used to generate clock signals applied to the pulse generator of FIG. 4.

FIG. 5 is a circuit diagram of a clock signal generation unit used to generate the clock signals applied to the pulse generator of FIG. 4. As illustrated in FIG. 5, the clock signal generation unit 200 includes a flip-flop 210, a two-by-two multiplexer (MUX) 220 and a first and a second logic multiplier A1 and A2.

A predetermined clock signal iSCLK is applied to a clock input G of the flip-flop 210, and an output signal CLK2 and an inverted output signal CLK2B are output from an output Q and an inverted output QB, respectively, of the flip-flop 210. The inverted output signal CLK2B is applied to a data input D of the flip-flop 210. The output signal CLK2 and the inverted output signal CLK2B are complementary signals.

The first logic multiplier A1 receives and logically multiplies the output signal CLK2 by the predetermined clock signal iSCLK to produce the odd clock signal CLK_O.

The second logic multiplier A2 receives and multiplies the inverted output signal CLK2B by the predetermined clock signal iSCLK to produce the even clock signal CLK_E.

The two-by-two multiplexer 220 included in the clock signal generation circuit 200 receives the odd clock signal CLK_O and the even clock signal CLK_E from the first logic multiplier A1 and the second logic multiplier A2, respectively. The two-by-two multiplexer 220 outputs one of the odd clock signal CLK_O and the even clock signal CLK_E to the pulse generator 100 illustrated in FIG. 4 in response to a predetermined control signal SS. A system reset signal SYS_RSTB is applied to a reset input RN of the flip-flop 210, and the flip-flop 210 is reset in response to a low logic level of the system reset signal SYS_RSTB.

Figure 6:
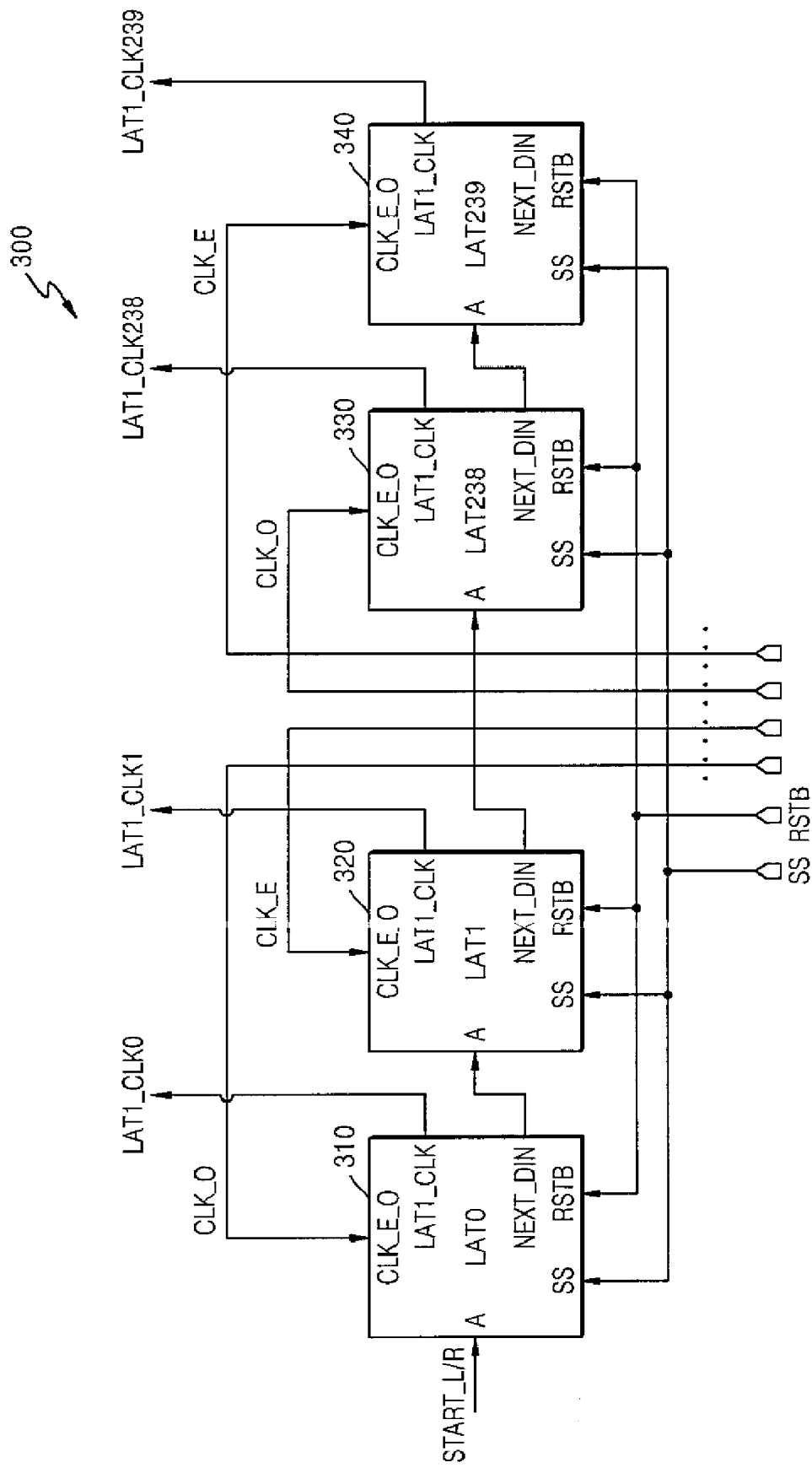
FIG. 6 is a circuit diagram of a control signal generation circuit according to an embodiment of the present invention.

FIG. 6 is a circuit diagram of a control signal generation circuit according to an embodiment of the present invention. The control signal generation circuit 300 generates a control signal to control a latch unit (not shown) included in a source driver (not shown) for sequentially latching color data applied to the source data lines.

Figure 7:
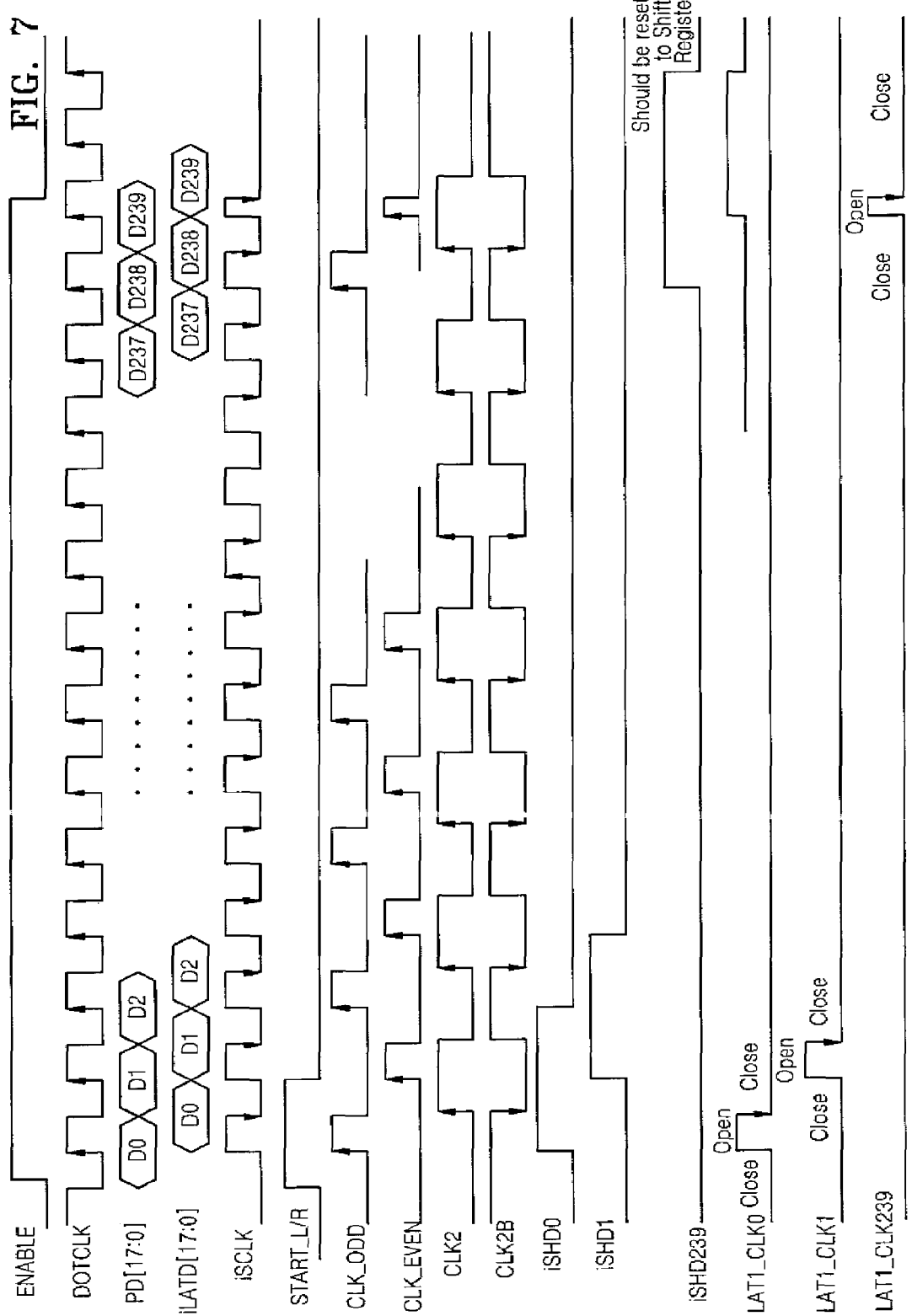
FIG. 7 is a timing diagram illustrating operations of the pulse generator of FIG. 4, the clock signal generation unit of FIG. 5, and the control signal generation circuit of FIG. 6.

The control signal generation circuit 300 includes about 240 pulse generators connected in series for latching about 240 color data signals, respectively. In FIG. 7 pulse generators 310 to 340 of the about 240 pulse generators are illustrated. The pulse generators 310 to 340 have the same structure and operation as those of the pulse generator 100 of FIG. 4.

At first, a start signal START_L/R is applied to a data input D of the first pulse generator 310, and the pulse generator 310 latches and outputs the start signal START_L/R as a next data signal NEXT_DIN in response to an odd clock signal CLK_O. The next data signal NEXT_DIN is applied to a data input D of the second pulse generator 320 connected in series with the first pulse generator 310.

The start signal START_L/R and the odd clock signal CLK_O are input to a logic unit included in the first pulse generator 310. The logic unit logically multiplies the start signal START_L/R with the odd clock signal CLK_O and outputs a latch signal LAT1_CLK0. The latch signal LAT1_CLK0 from the logic unit is used for latching a first color data signal of the 240 color data signals.

In response to an even clock signal CLK_E, the second pulse generator 320 receives and latches the next data signal NEXT_DIN from the first pulse generator 310, and produces a next data signal NEXT_DIN.

The next data signal NEXT_DIN of the second pulse generator 320 is input to a data input D of the third pulse generator 330 connected in series with the second pulse generator 320. A logic unit included in the second pulse generator 320 logically multiplies the next data signal NEXT_DIN applied to the data input D of the second pulse generator 320 by the even clock signal CLK_E, and outputs a latch signal LAT1_CLK1. The latch signal LAT1_CLK1 from the logic unit of the second pulse generator 320 is used as a latch signal for latching the second color data signal of the 240 color data signals.

In the same way as described above, an n-th pulse generator latches and applies a data signal in response to the predetermined divided clock signal. The divided clock signal becomes an odd clock signal CLK_O or an even clock signal CLK_E. The next data signal NEXT_DIN of the n-th pulse generator is transmitted to a data input D of the (n+1)-th pulse generator 330 connected in series with the n-th pulse generator 320 and the pulse signal generated from an n-th logic unit is used as a latch signal for latching the n-th color data signal.

FIG. 7 is a timing diagram illustrating operations of the pulse generator of FIG. 4, the clock signal generation unit of FIG. 5, and the control signal generation circuit of FIG. 6.

The first logic multiplier A1 of the clock signal generation circuit 200 logically multiplies the output signal CLK2 by the predetermined clock signal iSCLK to generate the odd clock signal CLK_O. The second logic multiplier A2 of the clock signal generation circuit 200 logically multiplies the inverted output signal CLK2B by the predetermined clock signal iSCLK to generate the even clock signal CLK_E.

The output signal CLK2 and the inverted output signal CLK2B have a period T2 of twice the period T1 of the predetermined clock signal iSCLK. The predetermined clock signal iSCLK has the same period as a sequential data latching cycle. Accordingly, the 2-divided clock signal CLK_E_O generated by the clock signal generation circuit 200 has a period of twice the period T1 of sequential data latching signals. And the 2-divided clock signal CLK_E_O has a pulse width of half the period T1 of the sequential data latching signals.

The 2-divided clock signal CLK_E_O generated by the clock signal generation circuit 200 is applied to the clock input G of the latch circuit 110 of the pulse generator 100 illustrated in FIG. 4. More specifically, the odd clock signal CLK_O is input to the clock terminal G of the latch circuit 110 of the first pulse generator 100.

The latch circuit 110 latches the start signal START_L/R applied to the data input D of the latch circuit 110 in response to the odd clock signal CLK_O. The start signal START_L/R can be generated using an ENABLE signal and a DOTCLK as illustrated in FIG. 7.

Referring to the timing diagram of FIG. 7, the start signal START_L/R is latched in response to a rising edge of the odd clock signal CLK_O. The latch circuit 110 applies the latched start signal START_L/R to the output Q of the latch circuit 110. Accordingly, the next data signal NEXT_DIN from the output Q of the latch circuit 110 has a pulse shape corresponding to a signal iSHD0 in FIG. 7. The signal iSHD0 is a latched signal in response to the odd clock signal CLK_O and has a pulse width corresponding to the period T2 of the odd clock signal CLK_O.

The start signal START_L/R and the odd clock signal CLK_O are applied to the two inputs of the NAND gate N1. The logic unit 120 logically multiplies the start signal START_L/R by the odd clock signal CLK_O as described above and outputs a latch signal LACT1_CLK. The latch signal LACT1_CLK from the logic unit 120 is used as a control signal to latch the input data applied to a source data line.

The latch signal LAT1_CLK is at a high logic level when both the start signal START_L/R and the odd clock signal CLK_O are at high logic levels.

Accordingly, the latch signal LAT1_CLK from the pulse generator 100 of FIG. 4 is a latch signal LAT_CLK0 of FIG. 7.

A subsequent pulse generator (not shown) connected in series to the pulse generator 100 has the same structure as the pulse generator 100 of FIG. 4. The subsequent pulse generator receives the next data signal NEXT_DIN from the output Q of the latch circuit 110 of the pulse generator 100 as an input. The subsequent pulse generator performs a latch function in response to the even clock signal CLK_E.

The subsequent pulse generator receives a signal iSHD0 corresponding to the next data signal NEXT_DIN of the pulse generator 100 and latches the signal iSHD0 in response to the even clock signal CLK_E. Accordingly, the subsequent pulse generator applies a signal corresponding to a signal iSHD1 of FIG. 7 through an output Q.

The signal iSHD0 and the even clock signal CLK_E are applied to a logic unit of the subsequent pulse generator. Accordingly, the output signal from the logic unit of the subsequent pulse generator corresponds to a signal LAT1_CLK1 of FIG. 7.

According to the operations described above, signals iSHD0 to iSHD239 and latch signals LAT1_CLK0 to LTA1_CLK239 are generated, respectively.

The latch signals LAT1_CLK0 to LAT1-CLK239 are used as control signals for sequentially latching received color data signals through the source data lines. The signal iSHD239 generated by the last pulse generator and has a pulse width determined by a reset timing of the last pulse generator.

Referring to the timing diagram of FIG. 7, the enable signal ENABLE is a control signal to control the application of a color data signal to a pixel forming an image. The timing diagram shows an operation of applying a color data signal PD[17:0] to the pixel during the time period when the enable signal ENABLE is active in response to a predetermined clock signal DOTCLK. A latch signal iLATD[17:0] represents sequentially latched color data controlled by the latch signal LAT1_CLK0 to the latch signal LAT1_CLK239.

Referring to the relationship between the latch signals LAT1_CLK0 to LAT1_CLK239 and iLATD[17:0], there is a timing margin corresponding to half a clock cycle. Accordingly, there is a sufficient timing margin for latching color data to the source data lines sequentially, and the color data can be latched stably.

It is feasible to minimize space occupation by substituting a latch for a flip-flop for generating a control signal. According to an exemplary embodiment of the present invention, since electric power is consumed in the gates to which a clock signal is applied whenever the predetermined clock signal toggles, using a latch as described above, the number of gates to which the clock signal is applied decreases by substituting latches for flip-flops.

Figure 8:
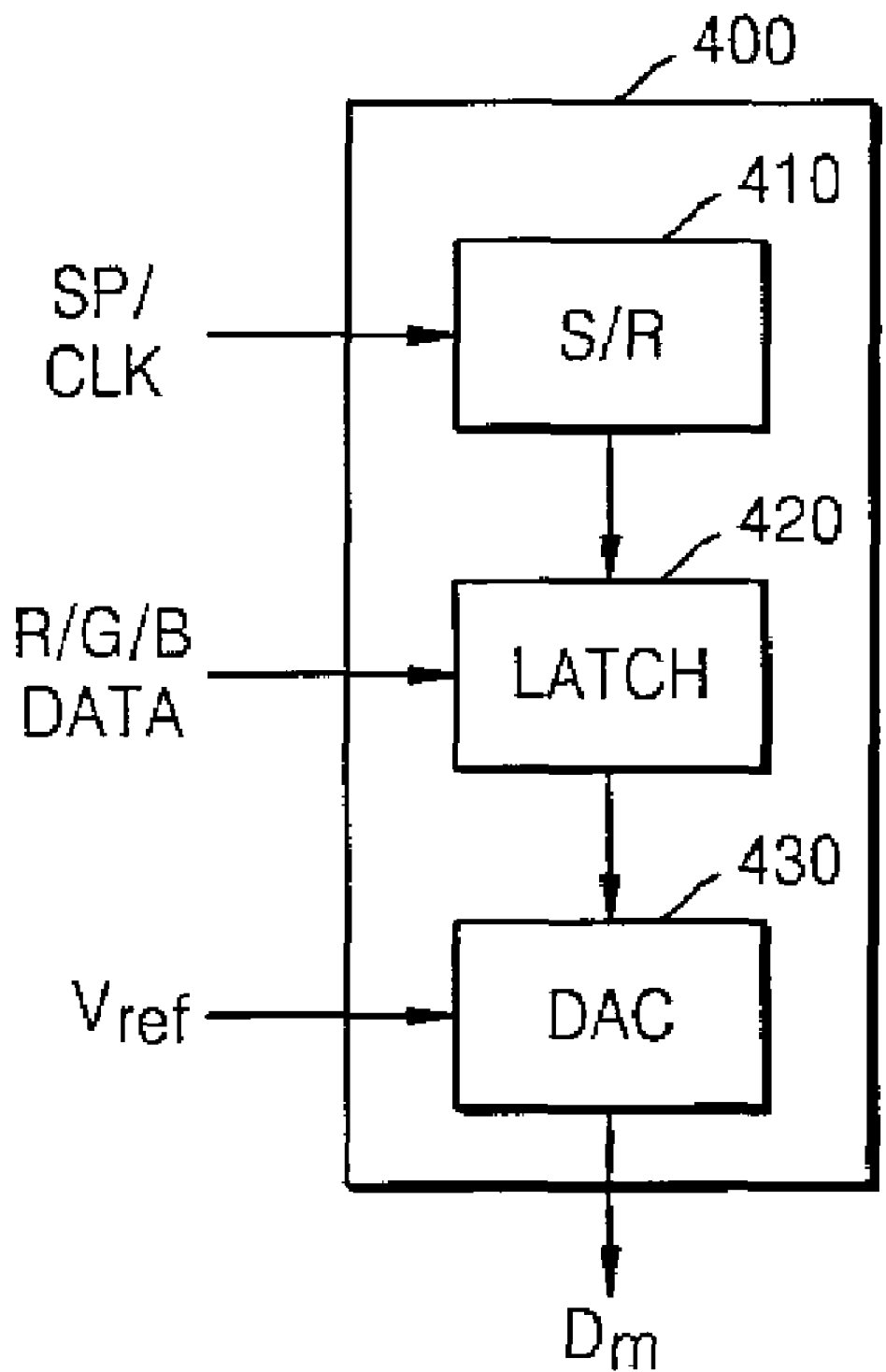
FIG. 8 is a block diagram of a source driving unit according to an embodiment of the present invention.

FIG. 8 is a block diagram of a source driving unit according to an embodiment of the present invention. The source driver 400 includes a shift register 410, a latch 420 and a digital-to-analog converter 430.

The shift register 410 generates a signal for controlling the latch 420 in response to a predetermined start signal SP and a clock signal CLK. The start signal SP corresponds to the start signal START_L/R described above, and color data R/G/B DATA applied to a source data line is sequentially latched according to a control signal applied from the control signal generation circuit 300 illustrated in FIG. 7. The latched and applied color data R/G/B DATA is converted by the digital-to-analog converter 430 and applied as color data Dm to implement a grayscale of an LCD device.

According to the present invention, in generating a control signal for sequentially latching color data from a source data line, it is possible to optimize space utilization and reduce electric power consumption.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A pulse generator generating a control signal to control a latch unit included in a source driver for sequentially latching input data applied to a source data line of a display device, wherein the pulse generator comprises:

a latch circuit latching an input signal in response to an N-divided clock signal and applying the latched input signal as an output signal; and a logic unit generating a pulse signal by logically multiplying the input signal by the N-divided clock signal, wherein the output signal is provided as an input signal to the latch circuit of another pulse generator, and the pulse signal is provided to the latch unit as the control signal.

2. The pulse generator of claim 1, wherein the logic unit comprises:

a NAND gate receiving the input signal and the N-divided clock signal, and performing a NAND operation on the received signals; and an inverter inverting an output of the NAND gate and outputting the inverted output signal of the NAND gate as the pulse signal.

3. The pulse generator of claim 1, wherein the N-divided clock signal is a 2-divided clock signal.

4. The pulse generator of claim 3, wherein the N-divided clock signal has a duration of twice a sequential data latching cycle and has a pulse width of half of the sequential data latching cycle.

5. The pulse generator of claim 4, wherein the output signal has a pulse width of one cycle of the N-divided clock signal.

6. The pulse generator of claim 5, wherein the pulse signal has the same pulse width as that of the N-divided clock signal.

7. A control signal generation circuit controlling a latch unit included in a source driver for sequentially latching input data applied to a source data line of a display device, the control signal generation circuit including a plurality of pulse generators, wherein each of the pulse generators comprises:

a latch circuit latching an input signal in response to an N-divided clock signal and applying the latched input signal as an output signal; and a logic unit generating a pulse signal by logically multiplying the input signal by the N-divided clock signal, wherein an output signal generated by an n-th (n is a natural number) pulse generator is applied to an input of an (n+1)-th pulse generator, and a pulse signal generated by the n-th pulse generator is applied as a control signal to the latch unit for latching an n-th input data.

8. The control signal generation circuit of claim 7, wherein the logic unit comprises:

a NAND gate receiving the input signal and the clock signal, and performing a NAND operation on the received signals; and an inverter inverting the output signal of the NAND gate and outputting the inverted output signal of the NAND gate.

9. The control signal generation circuit of claim 7, wherein the N-divided clock signal is a 2-divided clock signal.

10. The control signal generation circuit of claim 9, wherein the 2-divided clock signal comprises a first clock signal which is applied to odd pulse generators, and a second clock signal which is applied to even pulse generators.

11. The control signal generation circuit of claim 10, wherein the N-divided clock signal has a duration of twice a sequential data latching cycle and has a pulse width of half of the sequential data latching cycle.

12. The control signal generation circuit of claim 11, wherein the output signal has a pulse width of a period of the N-divided clock signal.

13. The control signal generation circuit of claim 12, wherein the pulse signal has the same pulse width as that of the N-divided clock signal.

* * * * *